(12) United States Patent
Tsorng et al.

(10) Patent No.: US 11,683,921 B2
(45) Date of Patent: Jun. 20, 2023

(54) TOOL FOR INSTALLATION OF OCP FORM FACTOR CARD

(71) Applicant: Quanta Computer Inc., Taoyuan (TW)

(72) Inventors: Yaw-Tzorng Tsorng, Taoyuan (TW); Jen-Jia Liou, Taoyuan (TW); Jui-Tang Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 219 days.

(21) Appl. No.: 17/195,048

(22) Filed: Mar. 8, 2021

(65) Prior Publication Data

US 2022/0201909 A1 Jun. 23, 2022

Related U.S. Application Data

(60) Provisional application No. 63/130,179, filed on Dec. 23, 2020.

(51) Int. Cl.
*H05K 13/04* (2006.01)
*G06F 1/18* (2006.01)
*H05K 7/14* (2006.01)

(52) U.S. Cl.
CPC ......... *H05K 13/0491* (2013.01); *G06F 1/186* (2013.01); *H05K 7/1402* (2013.01)

(58) Field of Classification Search
CPC .............. H05K 7/1402; H05K 7/1415; H05K 13/0007; H05K 13/0053; H05K 13/0447; H05K 13/0491; G06F 1/186; Y10T 29/53257; Y10T 29/53283; Y10T 29/53943

See application file for complete search history.

(56) References Cited

U.S. PATENT DOCUMENTS

| 9,877,407 | B1* | 1/2018 | Sim | H05K 7/1461 |
|---|---|---|---|---|
| 10,080,300 | B1* | 9/2018 | Olesiewicz | H05K 7/1402 |
| 2006/0185159 | A1* | 8/2006 | Correll | H01R 43/22 |
| | | | | 29/832 |
| 2007/0032114 | A1* | 2/2007 | Sanders | H01R 13/629 |
| | | | | 439/260 |
| 2009/0193641 | A1* | 8/2009 | Barna | H05K 7/1415 |
| | | | | 29/758 |
| 2015/0359148 | A1* | 12/2015 | Patti | G06F 1/185 |
| | | | | 29/758 |
| 2015/0364894 | A1* | 12/2015 | Marble | B25B 27/00 |
| | | | | 29/758 |
| 2021/0011529 | A1* | 1/2021 | Escamilla | G06F 1/186 |

\* cited by examiner

*Primary Examiner* — Peter Dungba Vo
*Assistant Examiner* — Joshua D Anderson
(74) *Attorney, Agent, or Firm* — Nixon Peabody LLP (57) ABSTRACT

An insertion tool for assisting in the insertion of an OCP 3.0 type expansion card in an expansion card slot of a computer system is disclosed. The expansion card may be a pull tab type form factor that does not have a mechanism such as an ejector latch to assist in applying force to insert the card. The expansion card has a front panel opposite a distal edge connector. The tool has a handle and a head coupled to the handle. The head has two contact areas that contact different areas of the front panel of the expansion card. For example, one of the contact areas may be an extended side arm and the other area may be a lateral rib extending from the head.

16 Claims, 12 Drawing Sheets

TOOL FOR INSTALLATION OF OCP FORM FACTOR CARD

PRIORITY CLAIM

This application claims priority from and benefit of U.S. Provisional Application No. 63/130,179, entitled "OCP 3.0 Card For No Ejector Feature" and filed on Dec. 23, 2020. The contents of that application are hereby incorporated by reference in their entirety.

TECHNICAL FIELD

The present disclosure relates generally to a tool for inserting Open Compute Project (OCP) cards into modular slots of a computer system. More particularly, aspects of this disclosure relate to a tool that assists in insertion of OCP cards that do not have an ejector lever.

BACKGROUND

Electronic devices, such as servers, include numerous electronic components that are powered by a common power supply. Generally, servers are directed toward specific functions such as storing large amounts of data or processing. Server design begins with a chassis that includes power components and general controllers such as a baseboard management controller (BMC). Current server designs include a large number of slots that accept device cards that may be plugged-in to perform server functions. For example, a storage server may include numerous solid state drive (SSD) device cards, while a processing server may include more device cards with processing units. Another example of a slot type is a slot for devices manufactured according to the Open Compute Project (OCP) protocol. The OCP issues periodic standard specifications that provide requirements for devices with form factors that meet such specifications.

A current generation of device cards meet the requirements of the OCP 3.0 Specification with a form factor that allows the device cards to be inserted through the front of the server chassis. This allows convenient attachment of the device cards without removing the server chassis from a rack. A small form factor (SFF) card according to the OCP 3.0 specification includes a circuit board that supports various electronic components including a network interface controller module. The circuit board has two small form factor pluggable modules that extend from one edge. An opposite edge of the circuit board includes an edge connector having 168 pins that may be inserted sideways through a slot in a front panel of a computer system to mate with either a right angle socket or a straddle socket on a motherboard. When the expansion card is inserted in the chassis, the small form factor pluggable modules of the card extend through an aperture on the side of the chassis. This allows communication connectors to be inserted to allow signals to be received on expansion card components such as a network interface controller.

There are several faceplates available for an OCP 3.0 expansion card—a pull tab version, an ejector latch version, and an internal lock version. A relatively large amount of force is necessary to fully insert the OCP 3.0 expansion card as the 168 pins of the connector edge must be fully inserted in the socket of the chassis motherboard. Therefore, approximately 92.4 N of force is required to insert the OCP 3.0 expansion card to a corresponding socket on a chassis motherboard. The ejector latch version has a rotating lever that allows a user to apply force to insert the OCP 3.0 expansion card. However, the ejector latch version of an OCP 3.0 expansion card is costlier due to the parts required for the mechanical ejector latch. Further certain manufacturers of OCP 3.0 expansion cards only offer either the pull tab version or internal lock form factor versions.

Since the pull tab and internal lock versions of OCP 3.0 expansion cards do not have an ejector latch, a user must apply sufficient force on a very small pull tab or an area on one side of the front panel of the OCP 3.0 expansion card to insert the card. Thus, because of the large force required to insert the connector, a user may have great difficulty in inserting the pull tab and internal lock versions of OCP 3.0 expansion cards in a server chassis. This difficulty is compounded by the pull tab being in proximity to the ports of the pluggable modules. The force applied by the user by their finger must avoid contacting the ports to prevent potential damage to the pluggable modules.

Thus, there is a need for a tool to facilitate the insertion of non-ejector latch version OCP 3.0 compliant expansion cards. There is also a need for a tool that distributes force evenly over the face of an OCP 3.0 expansion card to facilitate the connection of an edge connector with a socket on a chassis motherboard. There is also a need for a tool that protects the ports on the front of the OCP 3.0 expansion card from damage when the card is inserted.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

One disclosed example is a tool to assist in the insertion of an expansion card into an expansion card slot. The expansion card has a front plate opposite a distal edge connector. The tool includes a handle and a head coupled to the handle. The head has two contact areas in perpendicular relation to each other to contact two areas of the front plate of the expansion card.

A further implementation of the example tool is where the expansion card is compliant with the Open Compute Project 3.0 network interface controller form factor specification. Another implementation is where the handle includes contours for gripping by a user. Another implementation is where the handle and the head are fabricated from plastic material. Another implementation is where the expansion card is a pull tab type form factor. Another implementation is where one of the contact areas is on an extended arm and where the other contact area is on a lateral rib on the head. Another implementation is where the expansion card is an internal lock form factor. Another implementation is where the two contact areas are on two extended arms on opposite sides of the head. Another implementation is where the expansion card is one of a dual QSFP, Quad SFP, or a Quad RJ45 type.

Another disclosed example is a method of inserting an expansion card into a slot of a computer system. The expansion card includes a front plate opposite a distal edge connector. The expansion card is inserted in the slot. Two contact areas of a head of a tool are mated to corresponding areas of the front plate of the expansion card. A handle coupled to the head of the tool is gripped to apply force to push the expansion card fully into the slot.

A further implementation of the example method is where the expansion card is compliant with the Open Compute Project 3.0 network interface controller form factor specification. Another implementation is where the handle includes contours for gripping by a user. Another implementation is where the handle and the head are fabricated from plastic material. Another implementation is where the expansion card is a pull tab type form factor. Another implementation is where one of the contact areas is on an extended arm and where the other contact area is on a lateral rib perpendicular to the extended arm. Another implementation is where the expansion card is an internal lock form factor. Another implementation is where the two contact areas are on two extended arms on opposite sides of the head. Another implementation is where the expansion card is one of a dual QSFP, Quad SFP, or a Quad RJ45 type.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1A:
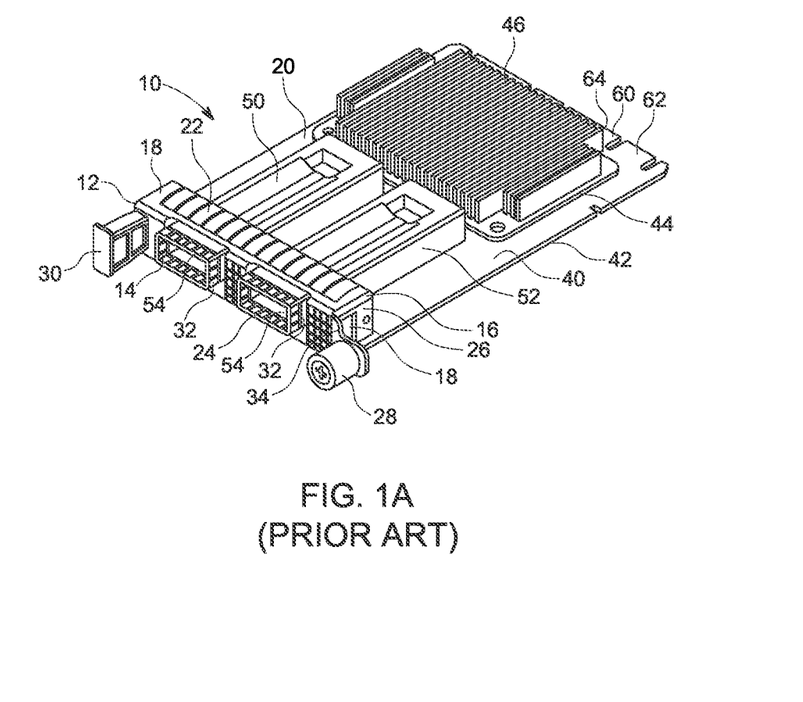
FIG. 1A is a perspective view of an example prior art OCP 3.0 dual quad small form factor pluggable (QSFP) expansion card with a pull tab faceplate.
Figure 1B:
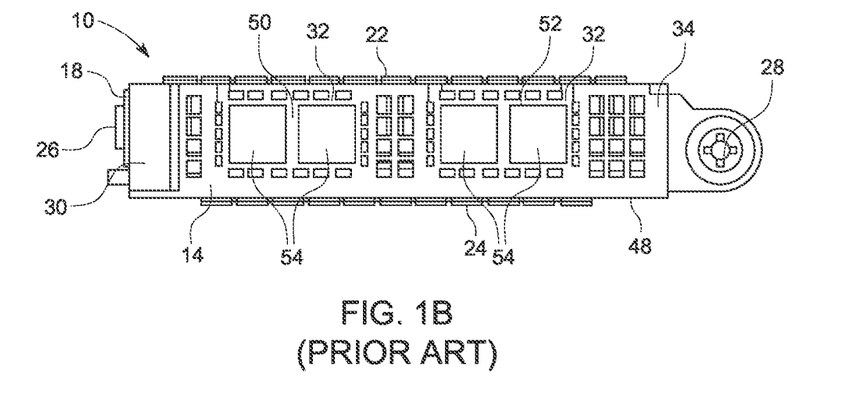
FIG. 1B is a front view of the prior art OCP 3.0 expansion card in FIG. 1A.
Figure 1C:
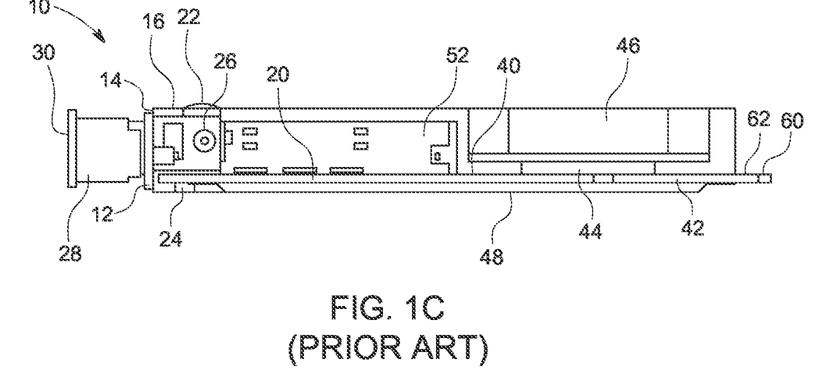
FIG. 1C is a side view of the prior art OCP 3.0 expansion card in FIG. 1A.
Figure 1D:
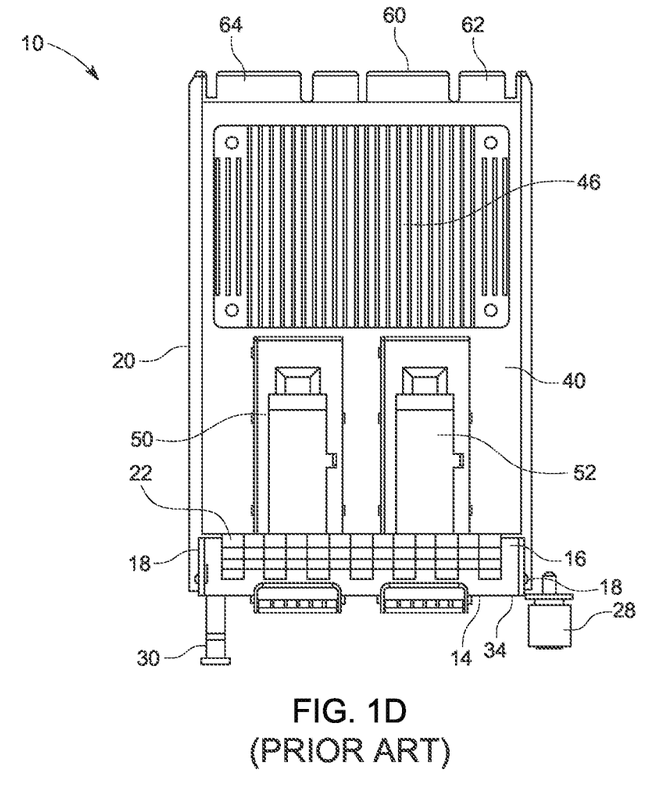
FIG. 1D is a top view of the prior art OCP 3.0 expansion card in FIG. 1A.

FIG. 1A shows a perspective view of a prior art expansion card 10 that may be inserted in a corresponding slot of a computer system such as a server. The expansion card 10 in this example is a small form factor (SFF) card that conforms to the pull tab version of the Open Compute Project (OCP) 3.0 specification. The expansion card 10 may be a network interface controller (NIC), a storage device, a processor device or other devices. FIGS. 1B, 1C, 1D show a front view, a side view, and a top view respectively of the OCP 3.0 expansion card 10.

As shown in FIGS. 1A-1D, the expansion card 10 includes a faceplate 12 that has a front plate 14 and a top plate 16. The front plate 14 has side tabs 18 that extend away from the exterior side of the front plate 14. The faceplate 12 is attached perpendicularly to a rectangular circuit board 20. A top electro-magnetic interference (EMI) finger 22 extends over the width of the expansion card 10 and is mounted on the top plate 16. A bottom EMI finger 24 extends over the width of the expansion card 10 and is mounted on the bottom of the front plate 14. Two EMI side fingers 26 are attached by rivets to either side tab 18 of the front plate 14. One side of the front plate 14 includes a thumbscrew 28 that may be rotated to secure the expansion card 10 to a chassis. The opposite side of the front plate 14 includes a pull tab 30 that extends from the front plate 14. The pull tab 30 is secured by screws to the faceplate 12. The front plate 14 includes two apertures 32 that allow modular components mounted on the circuit board 20 to extend outward. A side area 34 of the front plate 14 is at an opposite end from the end in proximity to the pull tab 30.

The circuit board 20 has a top surface 40 and a bottom surface 42 opposite to the top surface 40. The top surface 40 supports various electronic components including a network interface controller module 44 with a heat sink 46. An insulator layer 48 may be attached to the bottom surface 42 of the circuit board 20. The network interface controller module 44 is in communication with two small form factor pluggable modules 50 and 52. In this example, the two pluggable modules 50 and 52 are Quad Small Form-Factor Pluggable (QSFP) compact, hot-pluggable transceivers used for data communication applications. Each of the pluggable modules 50 and 52 have two sockets 54 that face out from the respective apertures 32 of the front plate 14. A distal edge 60 of the circuit board 20 includes a connection area 62 having 168 golden finger connectors that define an edge connector 64.

The edge connector 64 defines a primary connector that includes the 168 golden finger connectors. This may allow up to 16 PCIe lane implementations. The edge connector 64 is insertable into a straddle mount or right-angle connector socket on a motherboard of a computer system. The primary connector having the 168 card edge golden fingers are defined in and compliant to the SFF-TA-1002 standard. In this example, the primary connector is the "4C+" variant. The distal edge 60 of the circuit board 20 is implemented with the golden finger connectors on the top surface 40 of the circuit board 20.

Figure 2A:
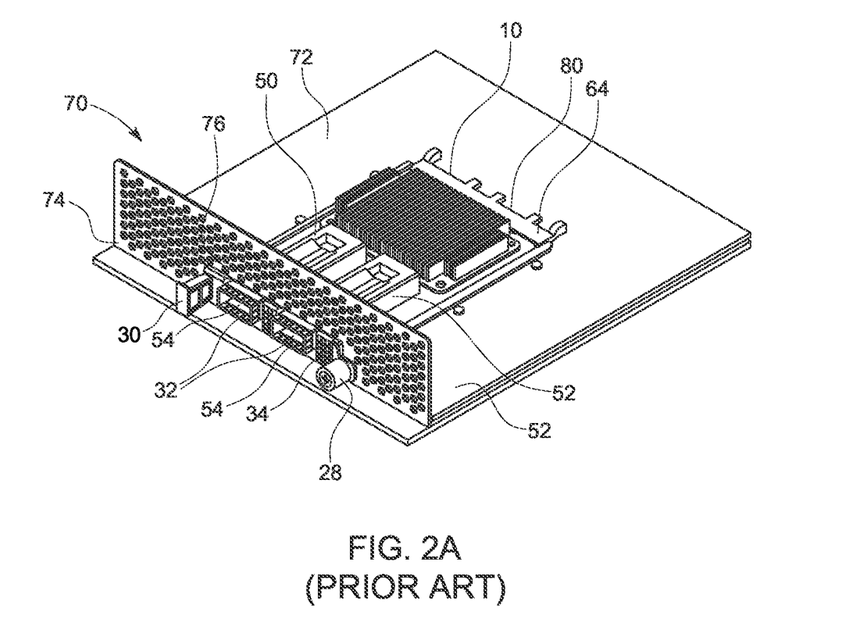
FIG. 2A is a cutaway perspective view of the OCP 3.0 expansion card in FIG. 1A installed on a motherboard of a computer system chassis.
Figure 2B:
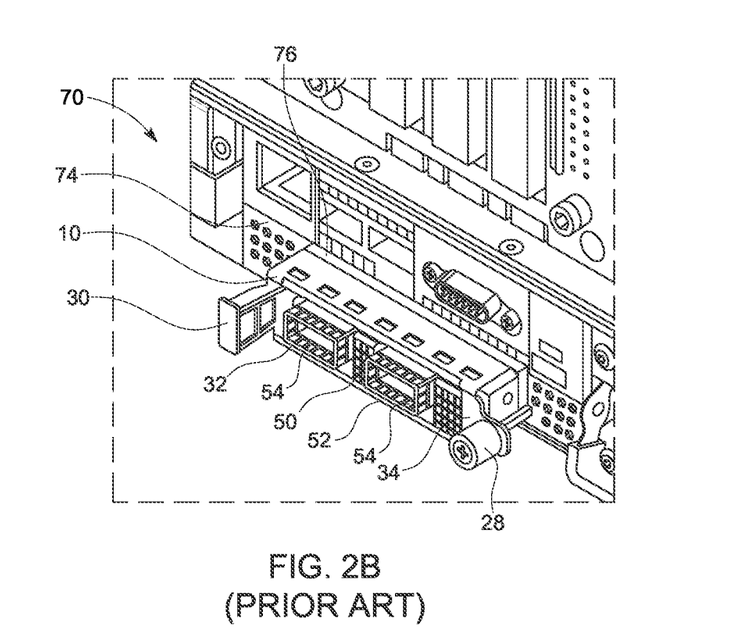
FIG. 2B is a perspective view of the OCP 3.0 expansion card partially inserted in the slot of the computer system chassis in FIG. 2A.
Figure 2C:
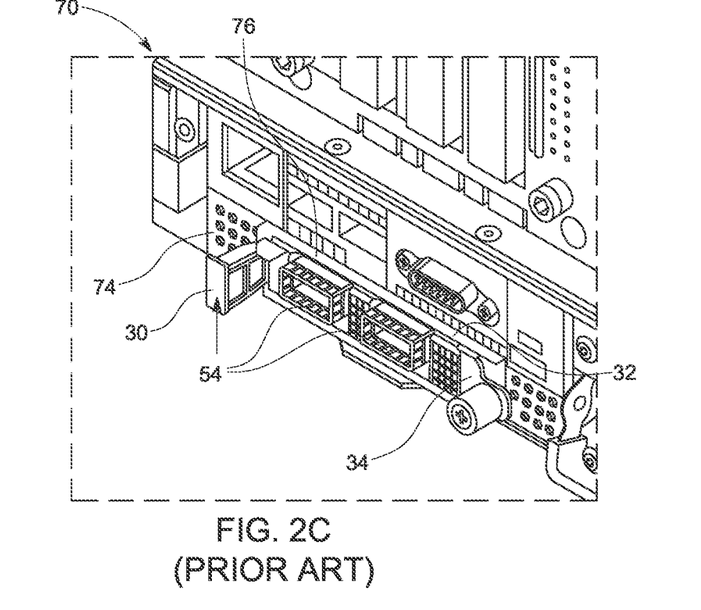
FIG. 2C is a perspective view of the OCP 3.0 expansion card fully inserted in the slot of the computer system chassis in FIG. 2A.

FIG. 2A is a cutaway perspective view of the OCP 3.0 expansion card 10 in FIG. 1A installed on a motherboard 72 of a computer system chassis 70. FIGS. 2B-2C show perspective views of the OCP 3.0 expansion card 10 partially and fully inserted in a slot of the computer system chassis 70 respectively. In this example, the computer system chassis 70 has a front panel 74 that includes a slot 76 that allows the expansion card 10 to be inserted from the front side of the computer system chassis 70. The sockets 54 of the small form factor pluggable modules 50 and 52 extend through the respective apertures 32 in the front panel 14 of the expansion card 10 and thus are accessible from the front of the computer system chassis 70. When the small form factor expansion card 10 is inserted fully into the slot 76 as shown in FIGS. 2A and 2C, the edge connector 64 is connected to a straddle mount connector socket 80 on the motherboard 72. Since the apertures 32 occupy a large area in the middle of the front panel 14 of the expansion card 10, the expansion card 10 is inserted by applying pressure to either the pull tab 30 or the side area 34 on either side of the apertures 32.

Figure 3A:
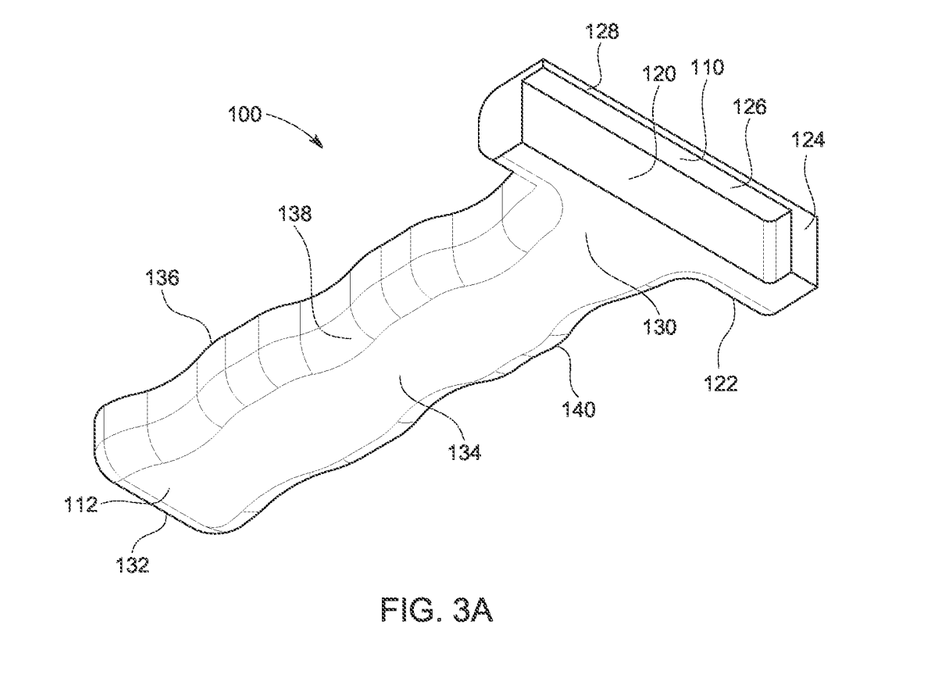
FIG. 3A is a front perspective view of an example insertion tool that facilitates insertion of a pull tab version of a OCP 3.0 expansion card in a chassis slot.
Figure 3B:
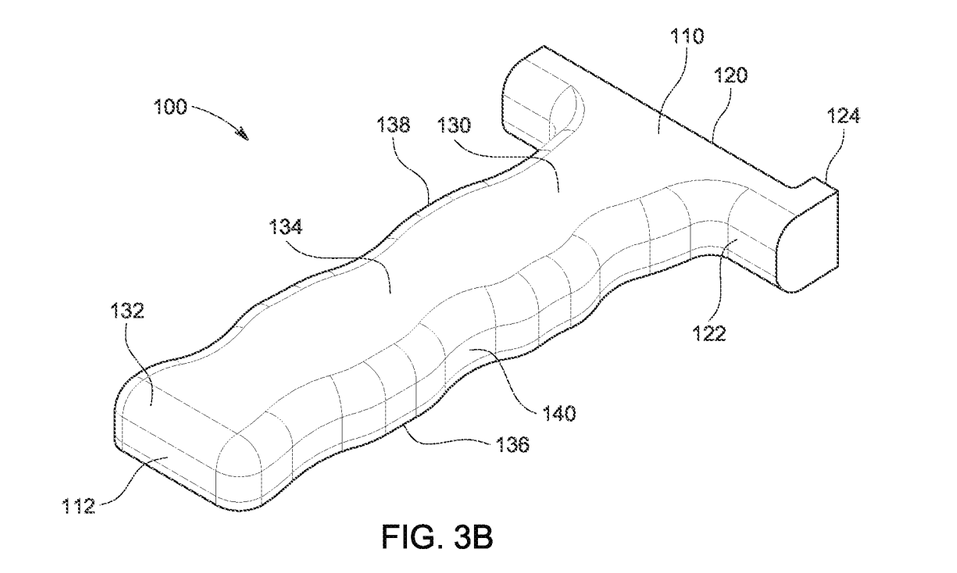
FIG. 3B is a rear perspective view of the example insertion tool in FIG. 3A.

FIG. 3A is a front perspective view of an example insertion tool 100 that allows for easy insertion and connection of the OCP 3.0 expansion card 10 in FIGS. 1A-1D through the slot 76 of the computer system chassis 70 in FIGS. 2A-2C, while FIG. 3B is a rear perspective view of the example insertion tool 100. The insertion tool 100 may be fabricated as a single piece from durable material such as plastic or metal. The insertion tool 100 includes a head 110 and a handle 112. The head 110 includes a front area 120 that has approximately the same area (length and width) as the cross sectional area of the front plate 14 of the expansion card 10 in FIGS. 1A-1D. The head 110 includes a rear end 122 that is opposite to the front area 120 and attached to the handle 112. The front area 120 is roughly a rectangular shape. The front area 120 is defined by two contact areas that extend from the face of the front area 120 to contact areas of the front plate of the expansion card such as the expansion card 10 in FIGS. 1A-1D. The two contact areas include the outer surface of an extended arm 124 that extends from one of the sides of the head 110. The extended arm 124 contacts the side area 34 of the front plate 14 of the expansion card 10 in FIGS. 1A-1D. A lateral rib 126 is arranged perpendicularly from the extended arm 124. The lateral rib 126 thus extends across one edge of the front area 120. The lateral rib 126 includes an exterior surface 128 to provide a second relatively thinner contact area across the width of the front area 120. The exterior surface 128 may contact the area of the front plate 14 either to the top of or the bottom of the apertures for the ports.

The handle 112 has one end 130 connected to the head 110 and an opposite end 132. The handle 112 has an exterior flat top surface 134 and an opposite bottom surface 136. The handle 112 has side surfaces 138 and 140 with contours to allow a user to grip the handle 112 and apply force. Since the user can grip the handle 112, there is minimal risk that the user's fingers will be injured trying to push the relatively small area of the pull tab 30 or the side area 34 to insert the expansion card 10 in FIGS. 1A-1D in a slot.

Figure 4A:
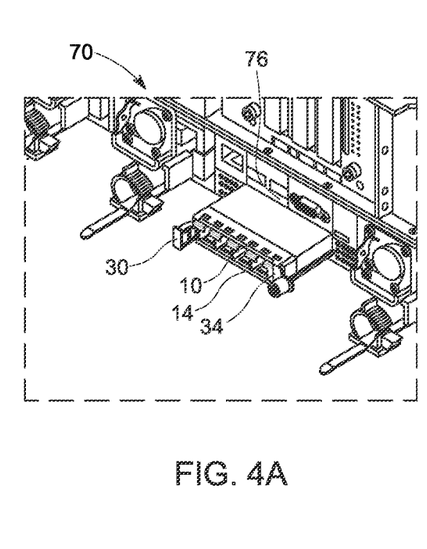
FIG. 4A is a perspective view of a pull tab OCP 3.0 expansion card partially inserted in a slot of a computer chassis.
Figure 4B:
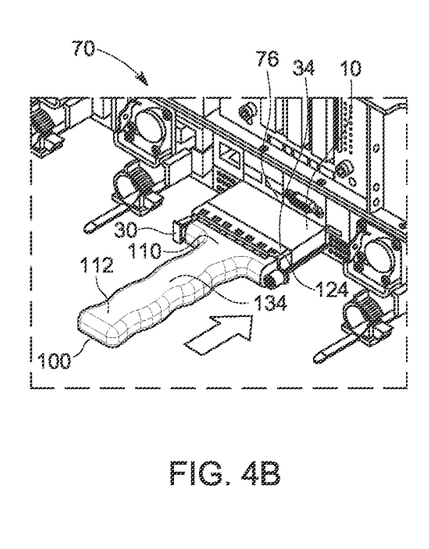
FIG. 4B is a perspective view of the example insertion tool of FIGS. 3A-3B in contact with the partially inserted OCP 3.0 expansion card in FIG. 4A.
Figure 4C:
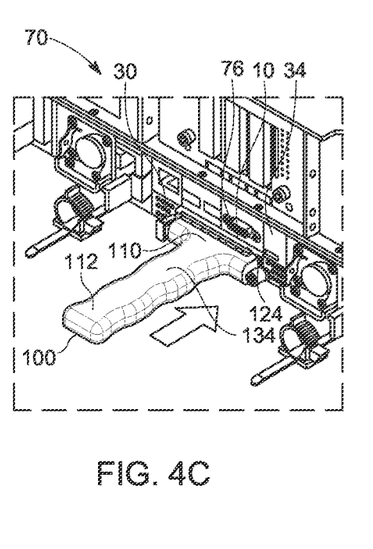
FIG. 4C is a perspective view of the fully inserted OCP 3.0 expansion card from force applied by the example insertion tool of FIGS. 3A-3B.

FIG. 4A-4C show a process of inserting the expansion card 10 using the insertion tool 100. In this example, the expansion card 10 is first aligned with the slot 76 of the computer system chassis 70 as shown in FIG. 4A. The head 110 of the insertion tool 100 is then aligned so the extended arm 124 contacts the side area 34 and the opposite side of the head 110 is guided by the pull tab 30 on the expansion card 10 as shown in FIG. 4B. Thus, the top surface 134 of the handle 112 is oriented on top. The exterior surface 128 of the rib 126 contacts the area of the front panel 14 under the apertures 32. Once the head 110 is aligned as shown in FIG. 4B, the user may grip the handle 112 of the insertion tool 100 and apply force to attempt to push the card 10 into the slot 76. The force is distributed by the head 110 on the front panel 14 in the area under the apertures 32 and the edge area 34 of the expansion card 10. In this manner, the ports of modules extending from the apertures 32 on the front plate 14 of the expansion card 10 are protected by the head 110 when the insertion tool 100 applies the force to push the expansion card 10 into the slot 76. This force pushes the expansion card 10 into the slot 76 to allow the edge connector 64 to be inserted in the socket 54 on the motherboard of the computer system chassis 70, thereby placing the expansion card 10 in the inserted position shown in FIG. 4C.

Figure 5A:
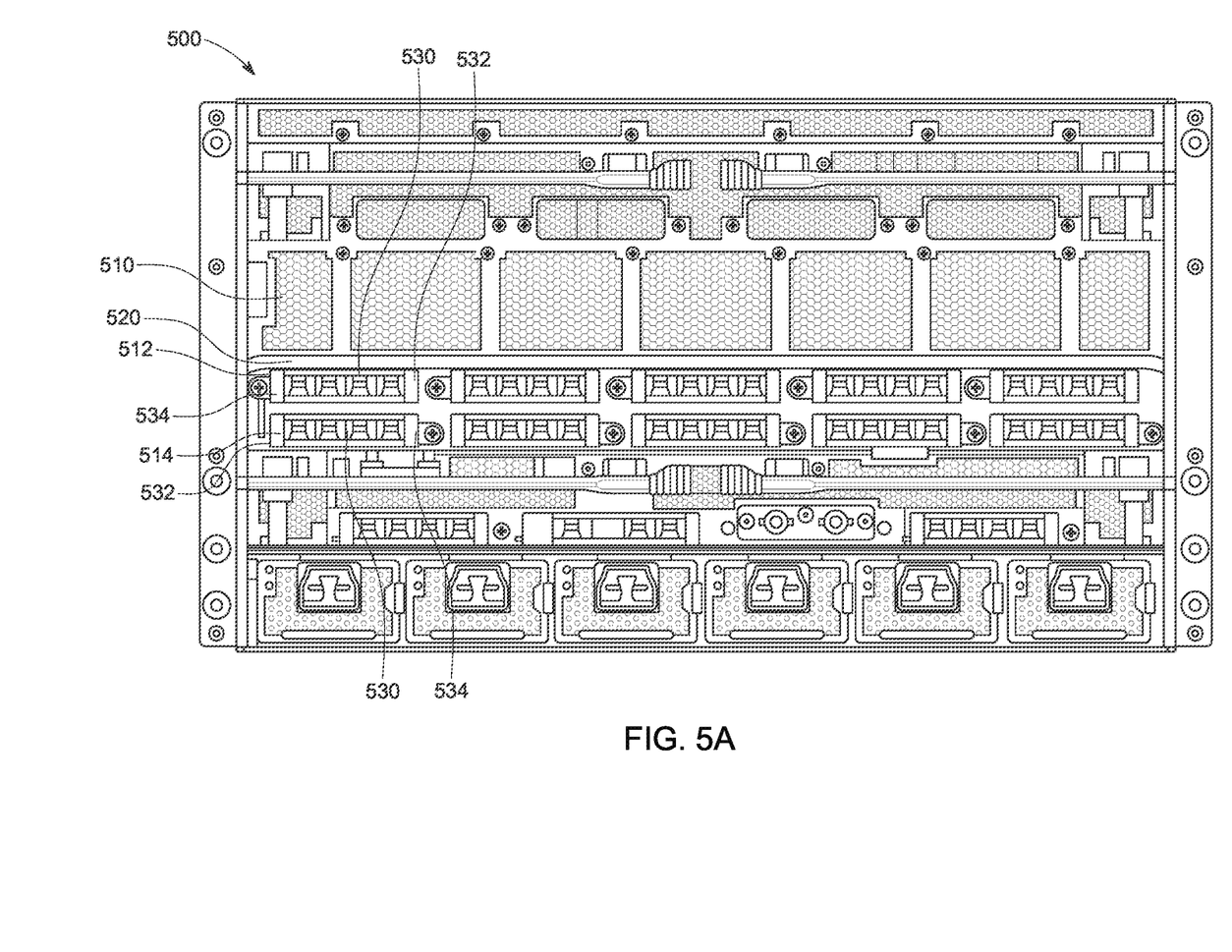
FIG. 5A is a front view of an example server chassis with multiple slots for OCP 3.0 expansion cards.

FIG. 5A is a front view of a server 500 with a front panel 510 with multiple card slots 520 that each accept an OCP 3.0 expansion card. In this example, the slots 520 are arranged in two rows. FIG. 5A shows an OCP 3.0 expansion card 512 that is inserted in one of the slots in a top row of the slots 520 and an OCP 3.0 expansion card 514 that is inserted in one of the slots in the bottom row of the slots 520. Both the expansion cards 512 and 514 include a front plate 530 with a pull tab 532 and an opposite side area 534. The slots of the bottom row are inverted relative to the slots of the top row and thus the components on the circuit board of the expansion card on the top and bottom rows face each other. The pull tabs 532 of the expansion cards in the bottom row is on the opposite side of the pull tabs 532 of the expansion cards in the top row.

Figure 5B:
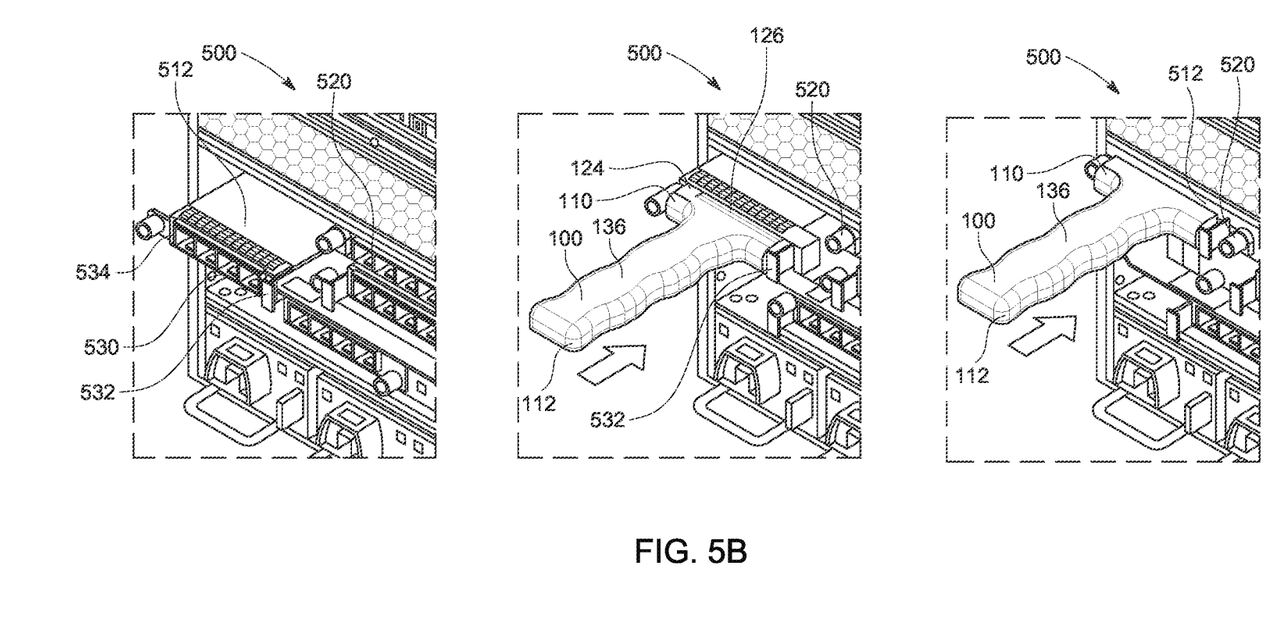
FIG. 5B is a sequence of images for showing insertion of a pull tab type OCP 3.0 expansion card in one of the top slots of the example server chassis in FIG. 5A using the example insertion tool of FIGS. 3A-3B.

FIG. 5B is a sequence of images that show the use of the insertion tool 100 in FIGS. 3A-3B to insert the expansion card 512 in one of the top row slots 520 of the server 500. The expansion card 512 is inserted partially in the slot 520 with the pull tab 532 adjacent to the right side. The head 110 of the insertion tool 100 is then placed in contact with the front plate 530 such that the side arm 124 contacts the side area 534 and the rib 126 contacts the edge area (top in FIG. 5B) of the front plate 530 of the expansion card 512. Thus, the bottom surface 136 of the handle 112 is oriented facing upward. The insertion tool 100 may then be used by a user to evenly apply force sufficient to push the expansion card 512 fully into the slot 520.

Figure 5C:
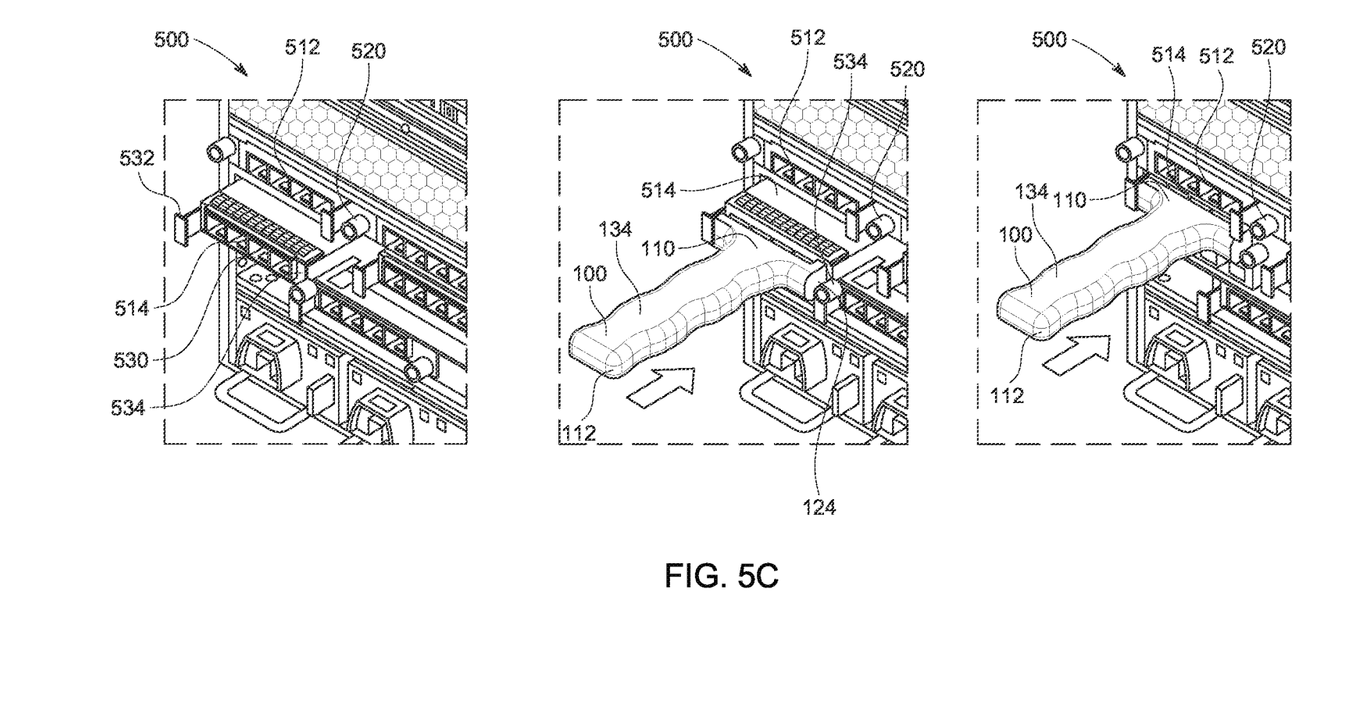
FIG. 5C is a sequence of images showing the insertion of a pull tab type OCP 3.0 expansion card in one of the bottom slots of the example server chassis in FIG. 5A using the example insertion tool of FIGS. 3A-3B.

FIG. 5C is a sequence of images that that show the use of the insertion tool 100 in FIGS. 3A-3B to insert the expansion card 514 in one of the slots 520 in the bottom row of the server 500. FIG. 5C shows the expansion card 512 already inserted in one of the slots 520 of the top row of the server 500. The expansion card 514 is inserted partially in the slot 520 with the pull tab 532 adjacent to the left side since the expansion card 514 is inverted from the orientation of the expansion card 512. The head 110 of the insertion tool 100 is then placed in contact with the front plate 530 such that the side arm 124 contacts the side area 534 and the rib 126 contacts the edge area (bottom in FIB. 5C) of the front plate 530 of the expansion card 514. Thus the insertion tool 100 is flipped over from the orientation in FIG. 5B and the top surface 134 of the handle 112 is oriented facing upward. The insertion tool 100 may then be used by a user to evenly apply force sufficient to push the expansion card 514 fully into the slot 520.

Figure 6A:
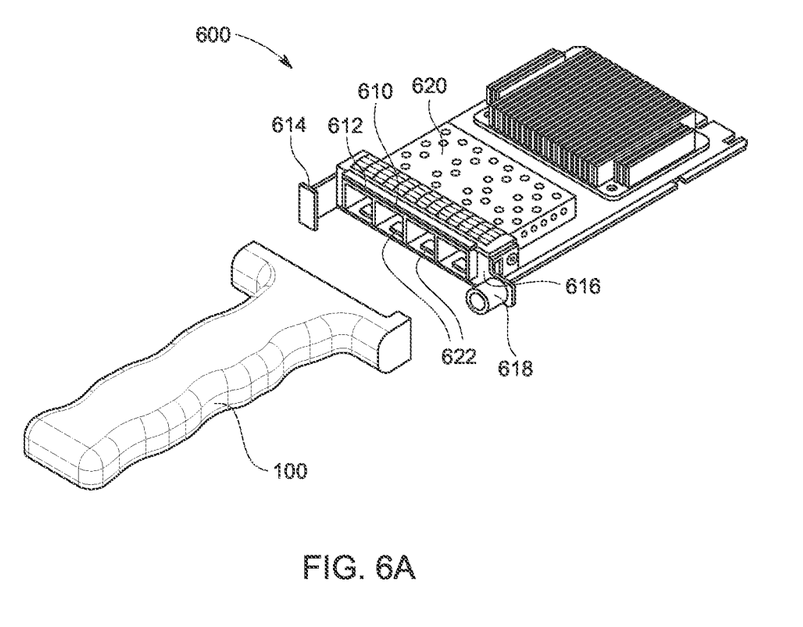
FIG. 6A is an example quad small form factor pluggable (SFP) OCP 3.0 expansion card and the example insertion tool of FIGS. 3A-3B.

FIG. 6A is a perspective view of the example insertion tool 100 for use with a Quad small form factor pluggable (SFP) type OCP 3.0 expansion card 600. The expansion card 600 includes a front plate 610 with a single rectangular aperture 612. The expansion card 600 has a pull tab 614 and a side area 616 between the aperture 612 and a locking screw 618. The expansion card 600 has a single transceiver 620 that includes four ports 622 extending from the aperture 612. The expansion card 600 is partially inserted in an expansion slot of a computer system. The insertion tool 100 is placed so the two contact areas of the head (the side arm and the lateral rib) are placed in contact with the side area 616 and the area of the front plate 610 under the ports 622 respectively. The insertion tool 100 then may be used to apply a force sufficient to push the expansion card 600 in an expansion card slot.

Figure 6B:
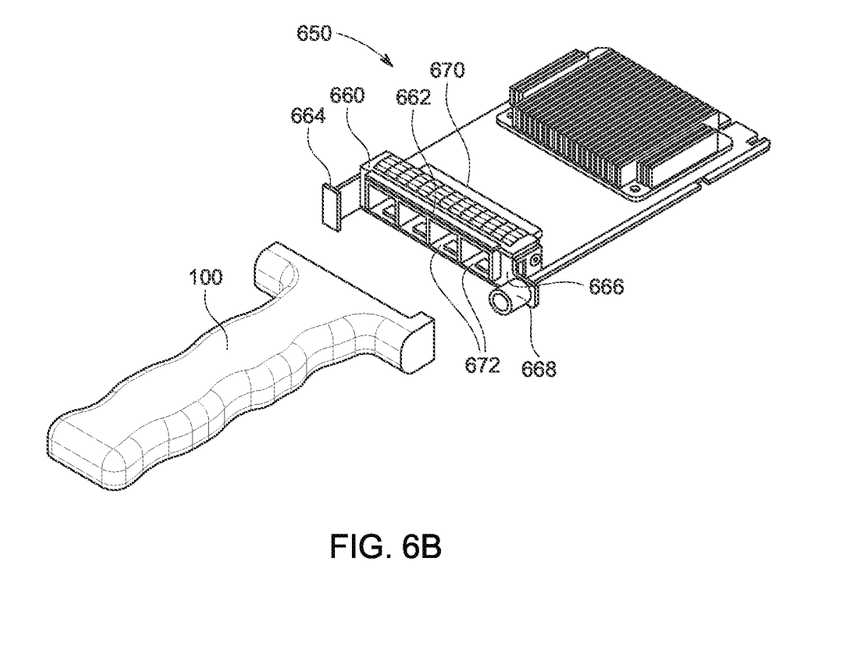
FIG. 6B is an example Quad RJ45 OCP 3.0 expansion card and the example insertion tool of FIGS. 3A-3B.

FIG. 6B is a perspective view of the example insertion tool 100 for use with a Quad RJ45 connector type OCP 3.0 expansion card 650. The expansion card 650 includes a front plate 660 with a single rectangular aperture 662. The expansion card 650 has a pull tab 664 and a solid area 666 between the aperture 662 and a locking screw 668. The expansion card 650 has a single RJ45 transceiver 670 that includes four RJ45 ports 672 extending from the aperture. The expansion card 650 is partially inserted in an expansion slot of a computer system. The insertion tool 100 is placed so the two contact areas of the head (the side arm and the lateral rib) are placed in contact with the side area 666 and the area of the front plate 660 under the ports 672 respectively. The insertion tool 100 then may be used to apply a force sufficient to push the expansion card 650 in an expansion card slot.

Figure 7A:
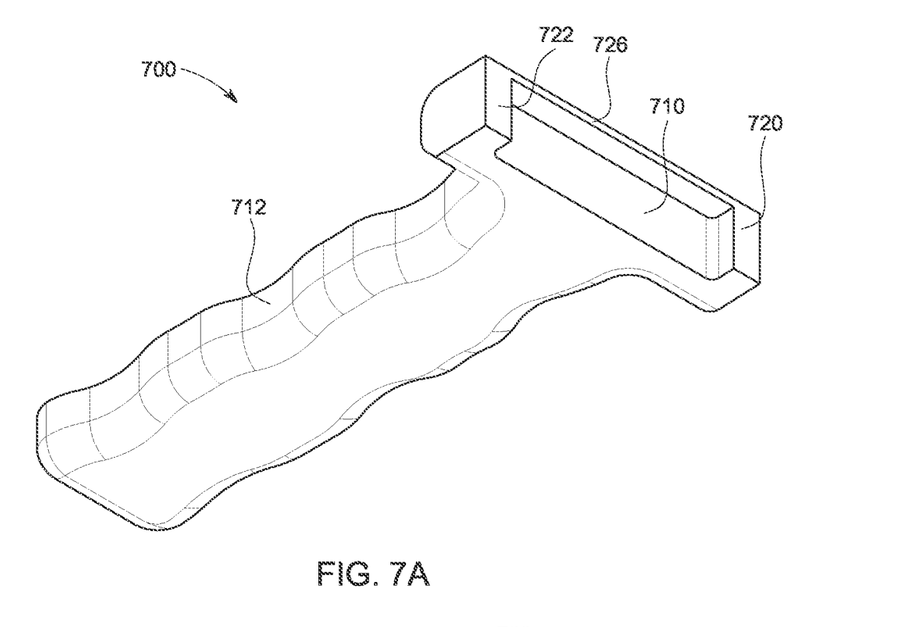
FIG. 7A is a front perspective view of another example insertion tool that may be used to insert an internal lock version OCP 3.0 expansion card.
Figure 7B:
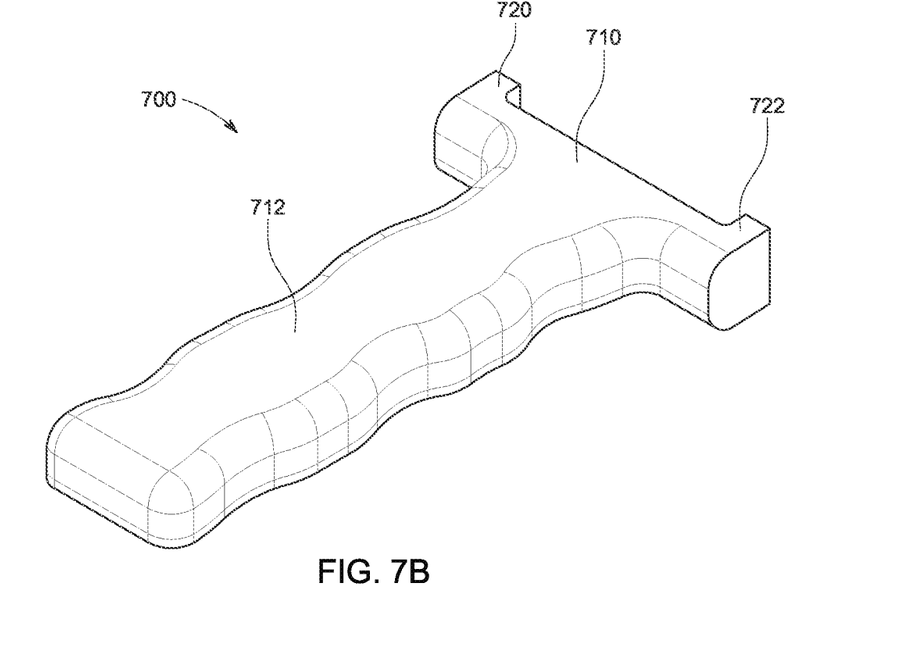
FIG. 7B is a rear perspective view of the example insertion tool in FIG. 7B.

FIG. 7A is a front perspective view of another example insertion tool 700 that may be used for inserting an internal link expansion card version of the OCP 3.0 standard. FIG. 7B is a rear perspective view of the example insertion tool 700 that provides an additional contact area with the front plate of an expansion card. It is to be understood that the insertion tool 100 may also be used for inserting internal link expansion cards meeting the OCP 3.0 standard.

The example insertion tool 700 has a head 710 and a handle 712. The handle 712 has contoured side surfaces to assist in gripping the handle 712. The head 710 has three contact areas spaced apart to contact opposite ends of the front panel of an expansion card. In this example, the two contact areas are two side arms 720 and 722 that extend from the head 710 and contact each of side areas of the front plate of an internal lock version of an OCP 3.0 expansion card. A lateral rib 726 extends on one of the lateral edges of the head 710 between the side arms 720 and 722. The exterior surface of the lateral rib 726 may contact the lateral edge of the front plate of an expansion card under the ports.

Figure 8A:
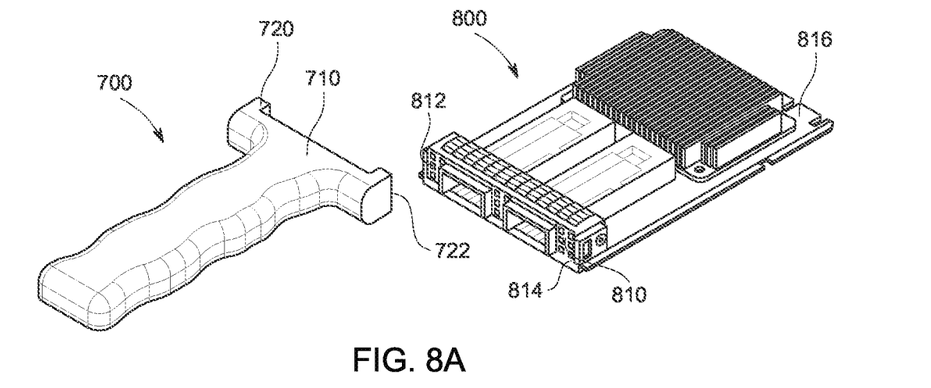
FIG. 8A is an example dual quad small form factor pluggable OCP 3.0 internal lock expansion card and the example insertion tool of FIGS. 7A-7B.
Figure 8B:
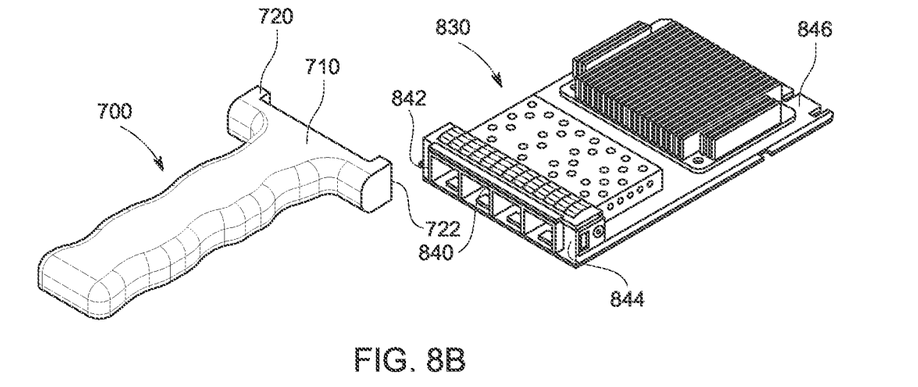
FIG. 8B is an example quad small form factor pluggable (SFP) OCP 3.0 internal lock expansion card and the example insertion tool of FIGS. 7A-7B.
Figure 8C:
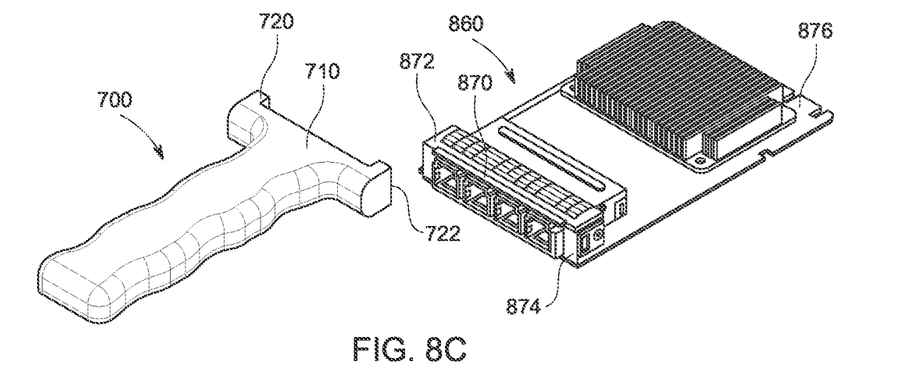
FIG. 8C is an example Quad RJ45 OCP 3.0 internal lock expansion card and the example insertion tool of FIGS. 7A-7B.

FIGS. 8A-8C show different versions of the OCP 3.0 internal lock expansion cards that may be inserted in a computer system with the example insertion tool 700 in FIGS. 7A-7B. FIG. 8A shows an internal lock dual QSFP OCP 3.0 expansion card 800 and the example insertion tool 700. The expansion card 800 has two QSFP transceivers that have two ports extending from respective apertures in a front plate 810. The front plate 810 has side areas 812 and 814 that border the respective apertures. An edge connector 816 with 168 connectors is located opposite the front plate 810. The insertion tool 700 allows the side arms 720 and 722 to contact the side areas 812 and 814 respectively. The lateral rib 726 is also placed in contact with the bottom of the front plate 810 under the ports. The insertion tool 700 therefore allows application of force from the side arms 720 and 722 to the side areas 812 and 814 and the bottom of the front plate 810 from the lateral rib 726 sufficient to insert the expansion card 800 fully into an expansion card slot of a computer system. The insertion tool 700 facilitates application of sufficient force to allow the edge connector 816 to be fully inserted in either a right-angle or straddle mount connection socket.

FIG. 8B shows an internal lock quad SFP OCP 3.0 expansion card 830 and the example insertion tool 700. The expansion card 830 has a transceiver that has four ports extending from an aperture in a front plate 840. The front plate 840 has side areas 842 and 844 that border the apertures. An edge connector 846 with 168 connectors is located opposite to the front plate 840. The insertion tool 700 allows the side arms 720 and 722 to contact the side areas 842 and 844 respectively. The lateral rib 726 is also placed in contact with the bottom of the front plate 840 under the ports. The insertion tool 700 therefore allows application of force from the side arms 720 and 722 to the side areas 842 and 844 and the bottom of the front plate 840 from the lateral rib 726 sufficient to insert the expansion card 830 fully into an expansion card slot of a computer system. The insertion tool 700 facilitates the application of sufficient force to allow the edge connector 846 to be fully inserted in either a right-angle or straddle mount connection socket.

FIG. 8C shows an internal lock quad RJ45 OCP 3.0 expansion card 860 and the example insertion tool 700. The expansion card 860 has a RJ45 transceiver that has four ports extending from an aperture in a front plate 870. The front plate 870 has side areas 872 and 874 that border the apertures. An edge connector 876 with 168 connectors is located opposite to the front plate 870. The insertion tool 700 allows the side arms 720 and 722 to contact the side areas 872 and 874 respectively. The lateral rib 726 is also placed in contact with the bottom of the front plate 870 under the ports. The insertion tool 700 therefore allows application of a force from the side arms 720 and 722 to the side areas 872 and 874 and the bottom of the front plate 870 from the lateral rib 726 sufficient to insert the expansion card 860 fully into an expansion card slot of a computer system. The insertion tool 700 facilitates the application of sufficient force to allow the edge connector 876 to be fully inserted in either a right-angle or straddle mount connection socket.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A tool to assist in the insertion of an expansion card into an expansion card slot, the expansion card having a front plate opposite a distal edge connector, the front plate including two perpendicular areas that are co-planar and arranged along perpendicular edges of the front plate, the tool comprising:
 a handle; and
 a head having a rear end coupled to the handle and a front area with a roughly rectangular shape outlined by four edges including a first edge connected to a second edge that are arranged perpendicularly to each other, the front area of the head having a first contact area defined by an outer surface of a lateral rib that extends from and across the first edge of the front area and a second contact area defined by an outer surface of a first arm that extends from the second edge of the front area, wherein the first and second contact areas are co-planar and connected in perpendicular relation to each other and protruding away from the front area, wherein the first and second contact areas are arranged to contact and apply an insertion force to the two perpendicular areas of the two perpendicular edges of the front plate of the expansion card during insertion of the expansion card into the expansion card slot.

2. The tool of claim 1, wherein the tool is capable of assisting in the insertion of an expansion card is compliant with the Open Compute Project 3.0 network interface controller form factor specification.

3. The tool of claim 1, wherein the handle includes one or more contours for gripping by a user.

4. The tool of claim 1, wherein the handle and the head are fabricated from plastic material.

5. The tool of claim 1, wherein the tool is capable of assisting in the insertion of is a pull tab type form factor expansion card.

6. The tool of claim 1, wherein the tool is capable of assisting in the insertion of an internal lock form factor expansion card.

7. The tool of claim 1, further comprising a second arm extending from a third edge of the front area, the second arm having a third contact area to contact a third area of the expansion card, wherein the two extended arms are on opposite sides of the head.

8. The tool of claim 1, wherein the tool is capable of assisting in the insertion of an expansion card that is one of a dual QSFP, Quad SFP, or a Quad RJ45 type.

9. A method of inserting an expansion card into a slot of a computer system, wherein the expansion card includes a front plate opposite a distal edge connector, the front plate including two perpendicular areas that are co-planar and arranged along perpendicular edges of the front plate, the method comprising:
 inserting the expansion card in the slot;
 mating two contact areas of a head of a tool to the two perpendicular areas of the front plate of the expansion card, wherein the head has a rear end and a front area with a roughly rectangular shape outlined by four edges including a first edge connected to a second edge that are arranged perpendicularly to each other, the front area of the head having the first contact area defined by an outer surface of a lateral rib that extends from and across the first edge of the front area and the second contact area defined by an outer surface of a first arm that extends from the second edge of the front area, wherein the first and second contact areas are co-planar and connected in perpendicular relation to each other and protruding away from the front area, wherein the corresponding areas are two perpendicular edges of the front plate of the expansion card; and gripping a handle coupled to the rear end of the head of the tool to apply force to the two perpendicular areas of the front plate with the two contact areas of the tool sufficient to push the expansion card fully into the slot.

10. The method of claim 9, wherein the tool is capable of assisting in the insertion of an expansion card compliant with the Open Compute Project 3.0 network interface controller form factor specification.

11. The method of claim 9, wherein the handle includes one or more contours for gripping by a user.

12. The method of claim 9, wherein the handle and the head are fabricated from plastic material.

13. The method of claim 9, wherein the tool is capable of assisting in the insertion of a pull tab type form factor expansion card.

14. The method of claim 9, wherein the tool is capable of assisting in the insertion of an internal lock form factor expansion card.

15. The method of claim 14, wherein the tool further includes a second arm extending from a third edge of the front area, the second arm having a third contact area to contact a third area of the expansion card, wherein the two extended arms are on opposite sides of the head.

16. The method of claim 9, wherein the tool is capable of assisting in the insertion of an expansion card of a dual QSFP, Quad SFP, or a Quad RJ45 type.

* * * * *